United States Patent
Masai et al.

(10) Patent No.: US 9,537,083 B2
(45) Date of Patent: Jan. 3, 2017

(54) PIEZOELECTRIC COMPOSITION AND PIEZOELECTRIC DEVICE

(71) Applicant: TDK CORPORATION, Tokyo (JP)

(72) Inventors: Taku Masai, Tokyo (JP); Masamitsu Haemori, Tokyo (JP); Masahito Furukawa, Tokyo (JP); Junichi Yamazaki, Tokyo (JP); Kouhei Ohhashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 261 days.

(21) Appl. No.: 14/201,515

(22) Filed: Mar. 7, 2014

(65) Prior Publication Data

US 2016/0141486 A1      May 19, 2016

(30) Foreign Application Priority Data

Mar. 29, 2013   (JP) ................... 2013-071998
Jan. 21, 2014   (JP) ................... 2014-008259

(51) Int. Cl.
| | |
|---|---|
| H01L 41/187 | (2006.01) |
| C04B 35/475 | (2006.01) |
| H01L 41/08 | (2006.01) |
| H01L 41/316 | (2013.01) |

(52) U.S. Cl.
CPC ......... *H01L 41/1878* (2013.01); *C04B 35/475* (2013.01); *H01L 41/0805* (2013.01); *H01L 41/316* (2013.01)

(58) Field of Classification Search
CPC . C04B 35/475; H01L 41/1878; H01L 41/1873
See application file for complete search history.

(56) References Cited

U.S. PATENT DOCUMENTS

2011/0298336 A1*  12/2011  Saito ............... B82Y 30/00
                                                    310/358
2014/0292160 A1*  10/2014  Kubota ........... H01L 41/0477
                                                    310/366

FOREIGN PATENT DOCUMENTS

| JP | B2-4177615 | 11/2008 |
|---|---|---|
| WO | WO 2012/013956 | * 2/2012 |
| WO | WO 2014/116244 | * 7/2014 |

OTHER PUBLICATIONS

Zou et al, "Microstructure and electrical propeties of (1-x)[0.82Bi0.5Na0.5TiO3-0.18Bi0.5K0.5TiO3]-xBiFeO3 lead-free piezoelectric ceramics", Journal of Alloy and Compounds, 495, Feb. 12, 2010, pp. 280-283.*

Zhou et al, "Structure and piezoelectric propeties of Bi0.5na0.5TiO3—Bi0.5K0.5TiO3—BiFeO3 lead-free ceramics", Materials Chemistry and Physics, 144, 2009, pp. 832-836.*

* cited by examiner

*Primary Examiner* — Carol M Koslow
(74) *Attorney, Agent, or Firm* — Oliff PLC

(57) ABSTRACT

Provided is a piezoelectric composition containing a major component that is a perovskite-type oxide which is represented by the general formula $ABO_3$, which contains no Pb, and which has A-sites containing Bi, Na, and K and B-sites containing Ti. The Ti is partly substituted with a transition metal element Me that is at least one selected from the group consisting of Mn, Cr, Fe, and Co. The content of Bi and the transition metal element Me in the perovskite-type oxide, which is the major component, is 6 mole percent to 43 mole percent in terms of $Bi_{u1}MeO_3$.

3 Claims, 3 Drawing Sheets

PIEZOELECTRIC COMPOSITION AND PIEZOELECTRIC DEVICE

BACKGROUND OF THE INVENTION

1. Field of the Invention

The present invention relates to a piezoelectric composition and piezoelectric device widely used in areas such as piezoelectric sounders, piezoelectric sensors, piezoelectric actuators, piezoelectric transformers, and piezoelectric ultrasonic motors.

2. Description of the Related Art

Piezoelectric compositions have the effect of inducing strain when electric fields are applied to the piezoelectric compositions from outside (the effect of converting electrical energy into mechanical energy) and the effect of generating a charge on the surface when stresses are applied to the piezoelectric compositions from outside (the effect of converting mechanical energy into electrical energy). In recent years, the piezoelectric compositions have been widely used in various areas. For example, a piezoelectric composition such as lead zirconate titanate (Pb(Zr, Ti)$O_3$, (PZT)) is excellent in micro-positioning and therefore is used to micro-position an optical system because the piezoelectric composition induces strain substantially in proportion to the voltage applied thereto on the order of $1 \times 10^{-10}$ m/V and therefore is excellent in micro-positioning. In contrast, the piezoelectric composition is used as a sensor for reading micro-force or deformation because the piezoelectric composition generates a charge with a magnitude proportional to the stress applied to the piezoelectric composition or the deformation due to the stress. Furthermore, the piezoelectric composition is used as a piezoelectric transformer, an ultrasonic motor, or the like because the piezoelectric composition has excellent response and therefore can induce resonance in such a way that the piezoelectric composition or an elastic body joined to the piezoelectric composition is excited by applying an alternating-current electric field thereto.

As of now, most of piezoelectric compositions in practical use are a type of solid solution (PZT) containing PbZr$O_3$—PbTi$O_3$ (PZ-PT). Products meeting various needs are being developed by adding various auxiliary components or additives to such PZT-type piezoelectric compositions. Examples of the products include those which have a low mechanical quality factor (Qm) and a high piezoelectric constant (d) and which are used in actuators, required to have a large displacement in direct-current applications, for positioning and those which have a low piezoelectric constant (d) and a high mechanical quality factor (Qm) and which are suitable for use in ultrasonic wave-generators, such as ultrasonic motors, used in alternating-current applications.

Piezoelectric compositions other than PZT-type piezoelectric compositions are in practical use. Most of these piezoelectric compositions are solid solutions made of a lead-based perovskite composition such as lead magnesate niobate (Pb(Mg, Nb)$O_3$, PMN).

However, lead-based piezoelectric compositions contain a large amount, about 60% to 70% by mass, of lead oxide, which has extremely high volatility at low temperature, as a major component. It is desired that the amount of lead oxide used is reduced in view of environmental concerns. Thus, if applications of piezoelectric ceramics and piezoelectric single-crystals are expanded in the future and therefore the amount of the piezoelectric ceramics and piezoelectric single-crystals used is increased, then the production of lead-free piezoelectric compositions will be an extremely important issue.

For example, barium titanate (BaTi$O_3$) and bismuth layered ferroelectrics are known as piezoelectric compositions containing no lead at all. However, barium titanate has a low Curie temperature, 120° C., and loses its piezoelectricity at a temperature not lower than the Curie temperature thereof. Therefore, barium titanate is not suitable for practical use in consideration of bonding by soldering or on-vehicle applications. On the other hand, the bismuth layered ferroelectrics usually have a Curie temperature of 400° C. or higher and are excellent in thermal stability. However, the bismuth layered ferroelectrics have high crystallographic anisotropy; hence, it is difficult to polarize the bismuth layered ferroelectrics by ordinary polarization. Therefore, a technique, represented by a hot forging process or the like, for inducing spontaneous polarization by shear stress is necessary. However, the technique has a problem with productivity.

On the other hand, novel piezoelectric compositions such as sodium bismuth titanate-based compositions are recently investigated. For example, Japanese Patent No. 4177615 (hereinafter referred to as the patent document) discloses piezoelectric compositions containing sodium bismuth titanate or barium titanate.

However, the sodium bismuth titanate-based piezoelectric compositions are unsuitable for obtaining sufficient piezoelectric properties as compared to lead-based piezoelectric compositions. In particular, the sodium bismuth titanate-based piezoelectric compositions are insufficient in spontaneous polarization and piezoelectric constant. Therefore, the sodium bismuth titanate-based piezoelectric compositions need to be improved in piezoelectric properties.

In the case of adding an element for the purpose of enhancing piezoelectric properties, elements contained in a perovskite structure react with an added oxide to produce many secondary phases, resulting in difficulty in polarization.

In general, Bi-based perovskite compositions are likely to have a heterogeneous structure containing coarse grains with a size of more than 100 μm and fine grains with a size of several micrometers because crystal grains are likely to be extraordinarily grown during firing. Therefore, it is difficult to control the structure of the Bi-based perovskite compositions.

A piezoelectric ceramic disclosed in the patent document contains a major component that is a perovskite-type composite oxide represented by the general formula AB$O_3$. In the general formula AB$O_3$, A is one or more selected from the group consisting of Bi, Na, K, and Ba; B is Ti; and B (that is, Ti) is partly substituted with a trivalent element M(III). In the composition range disclosed in the patent document, sufficient piezoelectric properties are not obtained. Since the amount of Bi in an A-site is invariant even if the amount of the added trivalent element M(III) is increased by a method described in the patent document, the deliquescence of an excessive alkali metal in an A-site occurs. Therefore, heterophases may possibly be induced with a change in sintering temperature.

SUMMARY OF THE INVENTION

The inventors have investigated the composition range of sodium bismuth titanate-based compositions in such a way that no segregation (including a secondary phase) or no heterogeneous structure is induced by controlling the amount of added Bi depending on the substitution amount of a B-site. It is an object of the present invention to provide a piezoelectric composition and piezoelectric device excellent from the viewpoint of low pollution, environmental friendliness, and ecology using a lead-free compound.

In order to achieve the above object, the inventors have investigated piezoelectric compositions which are sodium bismuth titanate-based compositions, which induce no segregation (including a secondary phase) or no heterogeneous structure, and which exhibit good piezoelectric properties. The inventors have found a piezoelectric composition different in composition range from conventional one.

A first piezoelectric composition according to the present invention contains a major component that is a perovskite-type oxide which is represented by the general formula $ABO_3$, which contains no lead (Pb), and which has A-sites containing Bi, Na, and K and B-sites containing Ti. The Ti is partly substituted with a transition metal element Me that is at least one selected from the group consisting of Mn, Cr, Fe, and Co. The content of Bi and the transition metal element Me in the perovskite-type oxide, which is the major component, is 6 mole percent to 43 mole percent in terms of $Bi_{u1}MeO_3$.

The transition metal element Me, which is contained in the piezoelectric composition, is at least one selected from the group consisting of Mn, Cr, Fe, and Co. The use of the transition metal element Me enhances the localization of electrons because of the limitation of the motion of the electrons to a specific orbit to make the screening of Coulomb potential incomplete and therefore enables the Coulomb interaction distance between the electrons to extend far.

As a result, the Coulomb interaction between A-site ions and B-site ions is increased and the symmetry of Coulomb potential is reduced. Hence, $Bi_{u1}MeO_3$ can take any one of a rhombohedral perovskite structure and a tetragonal perovskite structure and therefore has excellent piezoelectric properties.

The first piezoelectric composition contains the major component, which is the perovskite-type oxide which is represented by the general formula $ABO_3$ and which contains no lead (Pb). The content of the major component in the first piezoelectric composition is 95% or more. The first piezoelectric composition may further contain another component such as barium, strontium, or aluminium unless properties thereof are impaired.

A second piezoelectric composition according to the present invention is represented by the following formula:

$$(1-x-y)(Bi_{0.5}Na_{0.5})_{s1}TiO_3-y(Bi_{0.5}K_{0.5})_{t1}TiO_3-xBi_{u1}MeO_3$$

where $0.06 \leq x \leq 0.43$, $0.05 \leq y < 1$, $x+y < 1$, $0.75 \leq s1 \leq 1.0$, $0.75 \leq t1 \leq 1.0$, $0.75 \leq u1 \leq 1.0$, and Me represents a transition metal element that is at least one selected from the group consisting of Mn, Cr, Fe, and Co.

The $(Bi_{0.5}Na_{0.5})TiO_3$ has a rhombohedral perovskite structure, $(Bi_{0.5}K_{0.5})TiO_3$ has a tetragonal perovskite structure, and $BiMeO_3$ has a rhombohedral or tetragonal perovskite structure. Therefore, the second piezoelectric composition, as well as a PZT-based piezoelectric composition, has a composition close to the morphotropic phase boundary with $BiMeO_3$, which belongs to any one of the above crystal systems; hence, excellent piezoelectric properties can be achieved.

Furthermore, the first or second piezoelectric composition can be used to configure a piezoelectric device with excellent piezoelectric properties.

In a piezoelectric composition according to the present invention, the deliquescence of an excessive alkali metal in an A-site and the charge imbalance between A-sites and B-sites can be suppressed by adjusting the amount of added Bi and the induction of heterophases can be suppressed by a reduction in melting point due to the addition of Bi. The piezoelectric composition contains the third compound $Bi_{u1}MeO_3$ that belongs to a rhombohedral or tetragonal perovskite structure. Therefore, the piezoelectric composition meets piezoelectric properties such as spontaneous polarization and can provide a piezoelectric device with excellent piezoelectric properties.

Furthermore, a lead-free composition according to the present invention can provide a piezoelectric composition excellent from the viewpoint of low pollution, environmental friendliness, and ecology and a piezoelectric device containing the piezoelectric composition.

DESCRIPTION OF THE PREFERRED EMBODIMENTS

Figure 1:
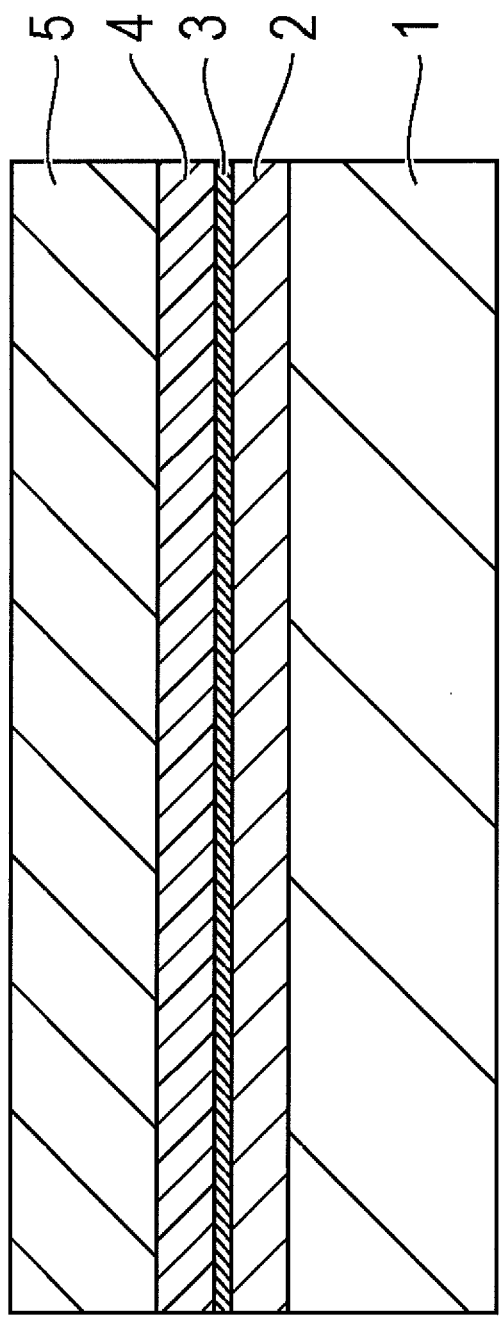
FIG. 1 is a schematic sectional view of a piezoelectric stack.

Embodiments of the present invention will now be described in detail.

A piezoelectric composition according to a first embodiment of the present invention contains a major component that is a perovskite-type oxide which is represented by the general formula $ABO_3$, which contains no Pb, and which has A-sites containing Bi, Na, and K and B-sites containing Ti. The Ti is partly substituted with a transition metal element Me that is at least one selected from the group consisting of Mn, Cr, Fe, and Co. The content of Bi and the transition metal element Me in the perovskite-type oxide, which is the major component, is 6 mole percent to 43 mole percent in terms of $Bi_{u1}MeO_3$.

The maximum polarization P is increased by adjusting the content of Bi and the transition metal element Me to the above range. This is because the ratio of the a-axis to c-axis of a perovskite lattice is large and the spontaneous polarization is increased. When the content thereof exceeds 43 mole percent, a phase causing a reduction in resistivity begins to be formed; hence, the spontaneous polarization begins to decrease and becomes unmeasurable.

The content of Bi and the transition metal element Me is preferably 15 mole percent to 40 mole percent and more preferably 25 mole percent to 35 mole percent in terms of $Bi_{u1}MeO_3$ because a larger value is obtained for the maximum polarization P.

The piezoelectric composition, which has the above composition, can suppress segregation (including a secondary phase) and a heterogeneous structure and a large value is obtained for the maximum polarization P; hence, the piezoelectric composition has excellent piezoelectric properties.

A piezoelectric composition according to a second embodiment of the present invention contains a major component which has a perovskite structure and which is represented by the following formula:

$$(1-x-y)(Bi_{0.5}Na_{0.5})_{s1}TiO_3 - y(Bi_{0.5}K_{0.5})_{t1}TiO_3 - xBi_{u1}MeO_3 \quad (1)$$

where $0.06 \leq x \leq 0.43$, $0.05 \leq y < 1$, $x+y<1$, $0.75 \leq s1 \leq 1.0$, $0.75 \leq t1 \leq 1.0$, $0.75 \leq u1 \leq 1.0$, and Me represents a transition metal element that is at least one selected from the group consisting of Mn, Cr, Fe, and Co.

Sodium bismuth titanate is cited as a first compound in Formula (1). The composition of sodium bismuth titanate is represented by Formula (2) below. Sodium and bismuth are located in A-sites of the perovskite structure and titanium is located in B-sites of the perovskite structure.

$$(Bi_{0.5}Na_{0.5})_{s1}TiO_3 \quad (2)$$

In Formula (2), s1 represents the composition ratio (hereinafter referred to as the A/B ratio) of an element located in the A-sites to an element located in the B-sites on a molar basis, is 1 in the case of a stoichiometric composition, and may deviate from the stoichiometric composition. When s1 is 1 or less, the sinterability can be enhanced and higher piezoelectric properties can be obtained, which is preferred. When s1 is less than 0.75, heterophases are induced and therefore piezoelectric properties are reduced. Hence, s1 is preferably within the range of 0.75 to 1.0.

Potassium bismuth titanate is cited as a second compound in Formula (1). The composition of potassium bismuth titanate is represented by Formula (3) below. Potassium and bismuth are located in the A-sites of the perovskite structure and titanium is located in the B-sites of the perovskite structure.

$$(Bi_{0.5}K_{0.5})_{t1}TiO_3 \quad (3)$$

In Formula (3), t1 represents the A/B ratio, is 1 in the case of a stoichiometric composition, and may deviate from the stoichiometric composition. When t1 is 1 or less, the sinterability can be enhanced and higher piezoelectric properties can be obtained. When t1 is less than 0.75, heterophases are induced and therefore piezoelectric properties are reduced. Hence, t1 is preferably within the range of 0.75 to 1.0.

For example, bismuth cobaltate is cited as a third compound. The composition of bismuth cobaltate is represented by Formula (4) below. Bismuth is located in the A-sites of the perovskite structure and cobalt is located in the B-sites of the perovskite structure.

$$Bi_{u1}CoO_3 \quad (4)$$

In Formula (4), u1 represents the A/B ratio, is 1 in the case of a stoichiometric composition, and may deviate from the stoichiometric composition. When u1 is 1 or less, the sinterability can be enhanced and higher piezoelectric properties can be obtained. When u1 is less than 0.75, heterophases are induced and therefore piezoelectric properties are reduced. Hence, u1 is preferably within the range of 0.75 to 1.0.

The third compound, as well as the first and second compounds, may have B-sites composed of a single type of element or several types of elements. When the B-sites are composed of several types of elements, the molar ratio (the A/B ratio) of an element in the A-sites to an element in the B-sites of each compound may be 1 in the case of a stoichiometric composition or may deviate from 1 and is preferably 1 or less, particularly within the range of 0.75 to 1.0.

A mixture of the first, second, and third compounds mixed at a certain ratio can be represented by the following formula:

$$(1-x-y)(Bi_{0.5}Na_{0.5})_{s1}TiO_3 - y(Bi_{0.5}K_{0.5})_{t1}TiO_3 - xBi_{u1}MeO_3 \quad (1)$$

where $0.06 \leq x \leq 0.43$, $0.05 \leq y < 1$, $x+y<1$, $0.75 \leq s1 \leq 1.0$, $0.75 \leq t1 \leq 1.0$, $0.75 \leq u1 \leq 1.0$, and the transition metal element Me is at least one selected from the group consisting of Mn, Cr, Fe, and Co. In Formula (1), $(1-x-y)$ represents the mole fraction of the first compound, y represents the mole fraction of the second compound, x represents the mole fraction of the third compound, and x and y satisfy the above inequalities.

When x satisfies the inequality $0.15 \leq x \leq 0.40$, y satisfies the inequality $0.05 \leq y < 1$, and x and y satisfy the inequality $x+y<1$, a larger value is obtained for the maximum polarization P, which is preferred.

Furthermore, when x satisfies the inequality $0.25 \leq x \leq 0.35$, y satisfies the inequality $0.1 \leq y < 1$, and x and y satisfy the inequality $x+y<1$, a further larger value is obtained for the maximum polarization P, which is preferred.

The case where x or y does not satisfy any of the above inequalities deviates from the morphotropic phase boundary between the first compound, which has a rhombohedral perovskite structure, the second compound, which has a tetragonal perovskite structure, and the third compound, which has one of a rhombohedral perovskite structure and a tetragonal perovskite structure, and therefore piezoelectric properties are reduced. In the present invention, the composition ratio is a value for a whole piezoelectric composition including solid solutions and non-solid solutions.

The piezoelectric composition according to the first or second embodiment may contain an element other than the elements contained in any one of the first to third compounds in the order of about tens to hundreds of parts per million (ppm) in the form of an impurity or a constituent of another compound. Examples of such an element include barium, strontium, calcium, lithium, hafnium, nickel, tantalum, silicon, boron, aluminium, and rare-earth elements.

The piezoelectric composition according to the first or second embodiment may contain lead, preferably has a lead content of 1% by mass or less, and more preferably contains no lead at all. This is preferable from the viewpoint of the volatilization of lead during firing, the fact that the emission of lead into the environment after the disposal of marketed piezoelectric components can be minimized, low pollution, environmental friendliness, and ecology.

The piezoelectric composition according to the first or second embodiment may further contain a minor component which is a compound containing at least one element such as Cu or Al. The content of the minor component is 0.04% to 0.6% by mass in terms of this element on the basis of the whole major component.

The piezoelectric composition according to the first or second embodiment has such a configuration and can be produced by, for example, a method below.

First, starting materials, that is, powders of bismuth oxide, sodium carbonate, potassium carbonate, titanium oxide, iron oxide, cobalt oxide, copper oxide, chromium oxide, and/or manganese oxide are prepared as required, are sufficiently dried at 100° C. or higher, and are then weighed depending on a target composition. For the starting materials, compounds, such as carbonates or oxalates, converted into oxides by firing may be used instead of the above oxides or oxides or other materials converted into oxides by firing may be used instead of the above carbonates.

Next, the weighed starting materials are sufficiently mixed for 5 hours to 20 hours in an organic solvent or water using, for example, a ball mill, are sufficiently dried, and are then press-molded, followed by calcination at 750° C. to 900° C. for 1 hour to 3 hours. Subsequently, the calcine is crushed for 5 hours to 30 hours in an organic solvent or water using a ball mill or the like and is dried again. A binder solution is added to the resulting calcine, followed by granulation. After granulation, the granular powder is press-molded into a block-shaped molding.

The block-shaped molding is heat-treated at 400° C. to 800° C. for about 2 hours to 4 hours, whereby a binder is evaporated. The resulting block-shaped molding is fired at 950° C. to 1,300° C. for about 2 hours to 4 hours.

The heating rate and cooling rate during firing are both, for example, about 50° C./h to 300° C./h. After firing, an obtained sintered body is polished as required and is then connected to electrodes. Thereafter, the sintered body is polarized in such a way that an electric field of 5 MV/m to 10 MV/m is applied to the sintered body at 25° C. to 150° C. for about 5 minutes to 1 hour in silicon oil, whereby the piezoelectric composition according to the first or second embodiment is obtained.

Crystal grains of the piezoelectric composition, according to the first or second embodiment, obtained by the above method have an average size of about 0.5 μm to 20 μm.

The above method is referred to as a solid-state reaction method. A typical production method other than this method is a vapor-phase growth process. The vapor-phase growth process is a technique in which a source material (target material) is vaporized in a vacuum and a thin film with a thickness of about tens of nanometers to several micrometers is formed on a smooth substrate.

The vapor-phase growth process is preferably sputtering, evaporation, pulsed laser deposition, or the like. The use of these processes enables films which are dense on an atomic level to be formed and allows segregation to be unlikely to occur. In the vapor-phase growth process, a source material (target material) is physically vaporized and is deposited on a substrate. Excitation sources depend on deposition processes. Ar plasma, an electron beam, or a laser beam is used as an excitation source in the case of sputtering, evaporation, or pulsed laser deposition, respectively, and is applied to a target.

Though there are various processes for forming a piezoelectric thin film by vapor-phase growth as described above, a pulsed laser deposition process is described in detail as a typical example. In the pulsed laser deposition process, a substrate for deposition is heated to a temperature of 500° C. to 800° C. in a vacuum chamber. The substrate is heated in such a way that the attained degree of vacuum in the vacuum chamber is maintained at $1 \times 10^{-3}$ Pa to $1 \times 10^{-5}$ Pa, whereby the effect of improving the surface cleanliness of the substrate is obtained.

In a deposition step, a laser beam is applied to a target material and the target material is thereby vaporized, whereby a film is deposited on the substrate.

Parameters other than the temperature of the substrate include the power of a laser used, the collecting power of the laser, the distance between the substrate and the target material, and the like. Desired properties can be achieved by controlling these parameters.

An $O_2$ gas is supplied during the deposition of an oxide for the purpose of supplementing oxygen in some cases. The pressure of $O_2$ is preferably $1 \times 10^{-1}$ Pa to $1 \times 10^{-5}$ Pa. When the $O_2$ pressure is higher than $1 \times 10^{-1}$ Pa, a reduction in deposition rate may possibly be caused.

The target material, which is used as a source material for deposition, may be the sintered body, which is prepared by such a powder metallurgy process as described above. In the case of using the vapor-phase growth process, the piezoelectric composition according to the first or second embodiment is generally deposited on or above an Si substrate, an MgO substrate, an $SrTiO_3$ substrate, or the like. In the case of depositing the piezoelectric composition according to the first or second embodiment above the Si substrate, after an adhesive layer of Ti, Cr, or the like is formed on the Si substrate, a lower electrode made of Pt is provided on the adhesive layer.

After being deposited on the lower electrode, the piezoelectric composition according to the first or second embodiment is post-annealed as appropriate, whereby a desired crystal phase can be obtained. Examples of a process for obtaining a polycrystalline film include a process for growing crystals by heating a substrate and a process in which such a polycrystalline film is obtained in such a way that a film is formed at room temperature and is then fired at a desired temperature.

The piezoelectric composition according to the first or second embodiment can be used in, for example, piezoelectric sounders, piezoelectric sensors, piezoelectric actuators, piezoelectric transformers, piezoelectric ultrasonic motors, and the like and may be used in piezoelectric devices, other than these devices, capable of using a piezoelectric composition.

EXAMPLES

The present invention is further described below in detail with reference to examples and comparative examples. The present invention is not limited to the examples at all.

Examples 1 to 12

FIG. 1 is a sectional view of a piezoelectric stack fabricated in each of Examples 1 to 12. An Si substrate 1 was used to fabricate the piezoelectric stack. The Si substrate 1 was circular and had a diameter of 3 inches, a thickness of 0.5 mm, and a (100)-orientation. The Si substrate 1 had a thermal oxide 2, having a thickness of 500 nm, formed thereon. First, a Ti adhesive layer 3 and a Pt lower electrode layer 4 were formed above the Si substrate 1 by an RF magnetron sputtering process. The Ti adhesive layer 3 was located on the thermal oxide 2 and had a thickness of 20 nm. The Pt lower electrode layer 4 was located on the Ti adhesive layer 3, had a thickness of 200 nm, and was predominantly (111)-oriented. The thickness of the Ti adhesive layer 3 can be appropriately adjusted as long as the Ti adhesive layer 3 functions.

Conditions for forming the Ti adhesive layer 3 and the Pt lower electrode layer 4 were as follows: the temperature of the Si substrate 1 was room temperature, the discharge power was DC 100 W, introduced gas was Ar, and the deposition pressure was 0.3 Pa.

A piezoelectric thin film 5 was formed on the Pt lower electrode layer 4 by a pulsed laser deposition (PLD) process. The thickness of the piezoelectric thin film 5 was 500 nm. PLD targets used were a target made of $(Bi_{0.5}Na_{0.5})TiO_3$, a target made of $(Bi_{0.5}K_{0.5})TiO_3$, and a target with a Bi-to-Co molar ratio of 1:1. The deposition rate of $(Bi_{0.5}Na_{0.5})TiO_3$, that of $(Bi_{0.5}K_{0.5})TiO_3$, and that of Bi—Co were 0.02 nm/shot, 0.18 nm/shot, and 0.006 nm/shot, respectively. Composition ratios shown in Table 1 were obtained by adjusting the number of shots. Conditions for forming the piezoelectric thin film 5 were as follows: the temperature of the Si substrate 1 was room temperature, the laser power was 60 mJ, introduced gas was $O_2$, and the pressure was $1.33 \times 10^{-3}$ Pa. After being formed, the piezoelectric thin film 5 was heat-treated at 800° C. for 1 minute in an oxygen atmosphere. The piezoelectric stack was obtained by this procedure in each example.

Figure 2:
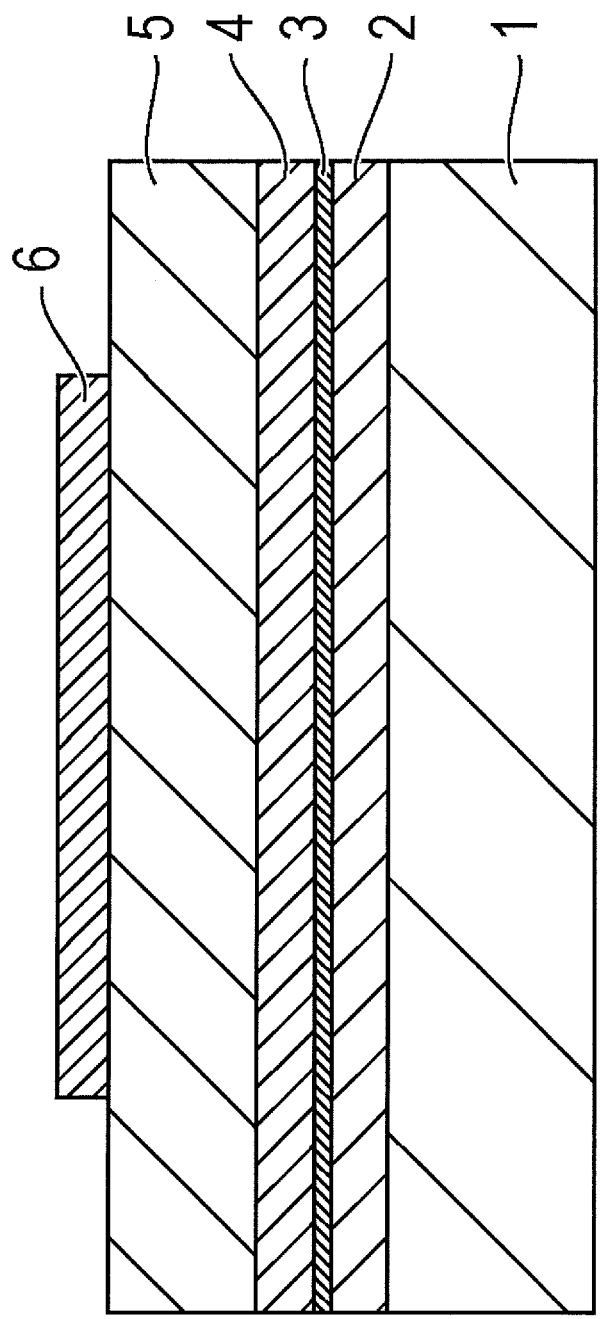
FIG. 2 is a schematic sectional view of a piezoelectric thin-film device for evaluating piezoelectric properties.

In order to evaluate electrical properties of the piezoelectric thin film 5, a layer of Pt with a thickness of 100 nm was deposited on the upper surface of the piezoelectric thin film 5 by an RF magnetron sputtering process as shown in FIG. 2. Conditions for forming the Pt layer were the same as the conditions forming the Pt lower electrode layer 4. Thereafter, the Pt layer was patterned by photolithography, etching, or the like, whereby an upper electrode 6 was formed. Finally, the piezoelectric stack having the upper electrode 6 was diced into 10 mm square pieces, whereby a piezoelectric thin-film device capable of being evaluated for electrical properties was fabricated as shown in FIG. 2.

In order to evaluate piezoelectric properties, the maximum polarization P ($\mu C/cm^2$) was measured. Since the spontaneous polarization is given by the product of the piezoelectric constant (C/N) and the stress ($N/m^2$), the spontaneous polarization ($C/m^2$) needs to be maximized in order to achieve a high piezoelectric constant.

Examples 13 to 32

In each of Examples 13 to 32, a piezoelectric thin-film device was fabricated in substantially the same way as that used in Examples 1 to 6 except that PLD targets used were a target with a Bi-to-Cr molar ratio of 1:1, a target with a Bi-to-Fe molar ratio of 1:1, a target with a Bi-to-Mn molar ratio of 1:1, and a target with a Bi-to-Mn-to-Co molar ratio of 1:0.5:0.5.

Comparative Examples 1 to 4

In each of Comparative Examples 1 to 4, a piezoelectric thin-film device was fabricated in substantially the same way as that used in the above examples except that $(Bi_{0.5}Na_{0.5})TiO_3$, $(Bi_{0.5}K_{0.5})TiO_3$, and $BiCoO_3$ were varied in composition ratio.

Comparative Examples 5 to 7

In each of Comparative Examples 5 to 7, a piezoelectric thin-film device was fabricated in substantially the same way as that used in Examples 13 to 32 except that $(Bi_{0.5}Na_{0.5})TiO_3$, $(Bi_{0.5}K_{0.5})TiO_3$, $BiCrO_3$, $BiFeO_3$, and $BiMnO_3$ were varied in composition ratio.

The maximum polarization P was measured in such a way that a Sawyer-Tower circuit was used, the frequency input to the Sawyer-Tower circuit was 10 kHz, and the electric field applied to the Sawyer-Tower circuit was 50 kV/mm.

Figure 3:
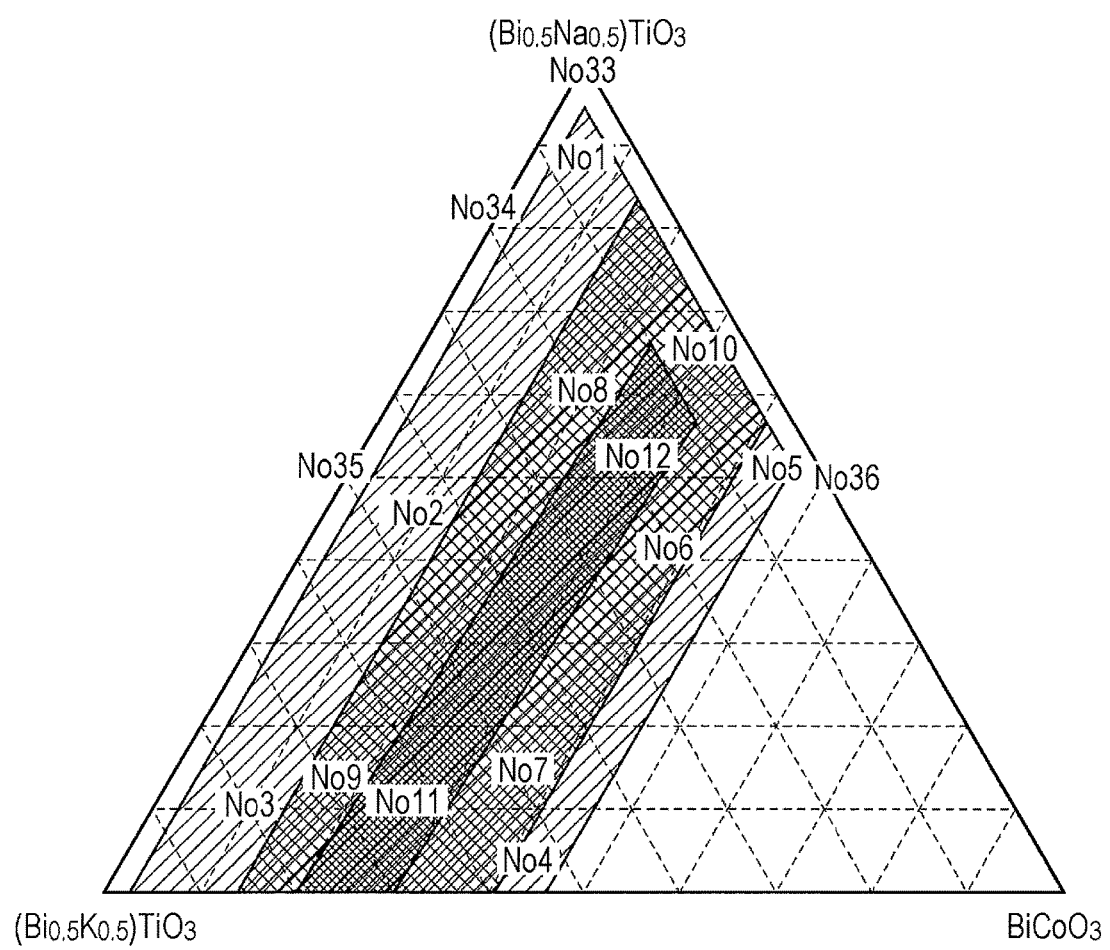
FIG. 3 is a phase diagram showing the relationship between piezoelectric properties and each of the composition ratio x of bismuth cobaltate, the composition ratio y of potassium bismuth titanate, and the composition ratio (1−x−y) of sodium bismuth titanate.

Evaluation results are shown in Table 1 and FIG. 3. FIG. 3 is a phase diagram showing the relationship between the maximum polarization P and each of the composition ratio of bismuth cobaltate ($BiCoO_3$), sodium bismuth titanate ($(Bi_{0.5}Na_{0.5})TiO_3$), and potassium bismuth titanate ($(Bi_{0.5}K_{0.5})TiO_3$).

TABLE 1

| | Samples | Added element (Me) | Composition ratio x of $BiMeO_3$ | Composition ratio y of $(Bi_{0.5}K_{0.5})TiO_3$ | Composition ratio 1 − x − y of $(Bi_{0.5}K_{0.5})TiO_3$ | Segregation | Maximum polarization P ($\mu C/cm^2$) |
|---|---|---|---|---|---|---|---|
| 1 | Example 1 | Co | 0.06 | 0.05 | 0.89 | Not observed | 19 |
| 2 | Example 2 | Co | 0.10 | 0.45 | 0.45 | Not observed | 19 |
| 3 | Example 3 | Co | 0.10 | 0.80 | 0.10 | Not observed | 16 |
| 4 | Example 4 | Co | 0.42 | 0.55 | 0.03 | Not observed | 16 |
| 5 | Example 5 | Co | 0.43 | 0.05 | 0.52 | Not observed | 19 |
| 6 | Example 6 | Co | 0.40 | 0.20 | 0.40 | Not observed | 22 |
| 7 | Example 7 | Co | 0.34 | 0.50 | 0.16 | Not observed | 24 |
| 8 | Example 8 | Co | 0.17 | 0.20 | 0.63 | Not observed | 24 |
| 9 | Example 9 | Co | 0.20 | 0.70 | 0.10 | Not observed | 22 |
| 10 | Example 10 | Co | 0.30 | 0.05 | 0.65 | Not observed | 23 |
| 11 | Example 11 | Co | 0.30 | 0.65 | 0.05 | Not observed | 31 |
| 12 | Example 12 | Co | 0.30 | 0.20 | 0.50 | Not observed | 30 |
| 13 | Example 13 | Cr | 0.06 | 0.05 | 0.89 | Not observed | 16 |
| 14 | Example 14 | Cr | 0.42 | 0.55 | 0.03 | Not observed | 15 |
| 15 | Example 15 | Mn | 0.06 | 0.05 | 0.89 | Not observed | 16 |
| 16 | Example 16 | Mn | 0.42 | 0.55 | 0.03 | Not observed | 15 |
| 17 | Example 17 | Fe | 0.06 | 0.05 | 0.89 | Not observed | 16 |
| 18 | Example 18 | Fe | 0.42 | 0.55 | 0.03 | Not observed | 15 |
| 19 | Example 19 | Co:Mn = 1:1 | 0.06 | 0.05 | 0.89 | Not observed | 16 |
| 20 | Example 20 | Co:Mn = 1:1 | 0.42 | 0.55 | 0.03 | Not observed | 15 |
| 21 | Example 21 | Cr | 0.40 | 0.20 | 0.40 | Not observed | 21 |
| 22 | Example 22 | Cr | 0.20 | 0.70 | 0.10 | Not observed | 20 |
| 23 | Example 23 | Mn | 0.40 | 0.20 | 0.40 | Not observed | 21 |
| 24 | Example 24 | Mn | 0.20 | 0.70 | 0.10 | Not observed | 20 |
| 25 | Example 25 | Fe | 0.40 | 0.20 | 0.40 | Not observed | 21 |
| 26 | Example 26 | Fe | 0.20 | 0.70 | 0.10 | Not observed | 20 |
| 27 | Example 27 | Co:Mn = 1:1 | 0.40 | 0.20 | 0.40 | Not observed | 21 |
| 28 | Example 28 | Co:Mn = 1:1 | 0.20 | 0.70 | 0.10 | Not observed | 20 |
| 29 | Example 29 | Cr | 0.30 | 0.20 | 0.50 | Not observed | 28 |
| 30 | Example 30 | Mn | 0.30 | 0.20 | 0.50 | Not observed | 27 |
| 31 | Example 31 | Fe | 0.30 | 0.20 | 0.50 | Not observed | 26 |
| 32 | Example 32 | Co:Mn = 1:1 | 0.30 | 0.20 | 0.50 | Not observed | 28 |
| 33 | Comparative Example 1 | Co | 0.00 | 0.00 | 1.00 | Not observed | 10 |
| 34 | Comparative Example 2 | Co | 0.00 | 0.20 | 0.80 | Not observed | 10 |
| 35 | Comparative Example 3 | Co | 0.00 | 0.50 | 0.50 | Not observed | 10 |
| 36 | Comparative Example 4 | Co | 0.50 | 0.20 | 0.30 | Not observed | Unmeasurable due to leakage |

TABLE 1-continued

| | Samples | Added element (Me) | Composition ratio x of BiMeO$_3$ | Composition ratio y of (Bi$_{0.5}$K$_{0.5}$)TiO$_3$ | Composition ratio 1 − x − y of (Bi$_{0.5}$K$_{0.5}$)TiO$_3$ | Segregation | Maximum polarization P (μC/cm$^2$) |
|---|---|---|---|---|---|---|---|
| 37 | Comparative Example 5 | CR | 0.50 | 0.20 | 0.30 | Not observed | Unmeasurable due to leakage |
| 38 | Comparative Example 6 | Mn | 0.50 | 0.20 | 0.30 | Not observed | Unmeasurable due to leakage |
| 39 | Comparative Example 7 | Fe | 0.50 | 0.20 | 0.30 | Not observed | Unmeasurable due to leakage |

As shown in Table 1 and FIG. 3, when the composition ratio x of bismuth cobaltate satisfies the inequality 0.06≤x≤0.43, the composition ratio y of potassium bismuth titanate satisfies the inequality 0.05≤y<1, and the composition ratio x of bismuth cobaltate and the composition ratio y of potassium bismuth titanate satisfy the inequality x+y<1, values that are 1.5 times or more those obtained in the comparative examples are obtained for the maximum polarization P.

That is, piezoelectric properties can be enhanced in such a way that a piezoelectric device is fabricated so as to contain sodium bismuth titanate, which is a first compound, and BiMeO$_3$, which is a third compound, or solid solutions thereof.

Furthermore, as shown in Examples 6 to 10, when the composition ratio x of bismuth cobaltate satisfies the inequality 0.15≤x≤0.40, the composition ratio y of potassium bismuth titanate satisfies the inequality 0.05≤y<1, and the composition ratio x of bismuth cobaltate and the composition ratio y of potassium bismuth titanate satisfy the inequality x+y<1, values that are 2.0 times or more those obtained in the comparative examples are obtained for the maximum polarization P.

As shown in Examples 11 and 12, when the composition ratio x of bismuth cobaltate satisfies the inequality 0.25≤x≤0.35, the composition ratio y of potassium bismuth titanate satisfies the inequality 0.1≤y<1, and the composition ratio x of bismuth cobaltate and the composition ratio y of potassium bismuth titanate satisfy the inequality x+y<1, values that are 2.5 times or more those obtained in the comparative examples are obtained for the maximum polarization P.

As shown in FIG. 3, the spontaneous polarization is further increased by adding potassium bismuth titanate. This is because the phase boundary between potassium bismuth titanate and sodium bismuth titanate can be used in addition to the effect of adding bismuth cobaltate.

In the above examples, similar results are obtained for manganese, iron, chromium, and the like, which can take the same valence, other than the composition of sodium bismuth titanate and bismuth cobaltate.

Examples 33 to 39 and Comparative Examples 8 and 9

Furthermore, in order to investigate the range of the A/B ratio (the values of s1, t1, and u1), compositions shown in Table 2 were investigated.

In Examples 33 to 39 and Comparative Examples 8 and 9, (Bi$_{0.5}$Na$_{0.5}$)$_{s1}$TiO$_3$ targets and (Bi$_{0.5}$K$_{0.5}$)$_{t1}$TiO$_3$ targets varied in A/B ratio (the values of s1, t1, and u1) were prepared. Furthermore, a target with a Bi-to-Co molar ratio of u1:1 was prepared. Piezoelectric thin-film devices were fabricated in substantially the same way as that used in the examples.

TABLE 2

| | Samples | Composition ratio x of (Bi$_{0.5}$Na$_{0.5}$)TiO$_3$ | Composition ratio y of Bi(Mg$_{0.5}$Ti$_{0.5}$)O$_3$ | Composition ratio z of BiCoO$_3$ | s1 | t1 | u1 | Maximum Pm of spontaneous polarization (μC/cm$^2$) |
|---|---|---|---|---|---|---|---|---|
| 40 | Example 33 | 0.30 | 0.65 | 0.05 | 1.00 | 1.00 | 1.00 | 31 |
| 41 | Example 34 | 0.30 | 0.65 | 0.05 | 0.90 | 0.90 | 0.90 | 30 |
| 42 | Example 35 | 0.30 | 0.65 | 0.05 | 0.88 | 0.92 | 0.91 | 30 |
| 43 | Example 36 | 0.30 | 0.65 | 0.05 | 0.80 | 0.80 | 0.80 | 28 |
| 44 | Example 37 | 0.30 | 0.65 | 0.05 | 0.82 | 0.77 | 0.81 | 28 |
| 45 | Example 38 | 0.30 | 0.65 | 0.05 | 0.75 | 0.75 | 0.75 | 28 |
| 46 | Example 39 | 0.30 | 0.65 | 0.05 | 0.75 | 0.76 | 0.77 | 28 |
| 47 | Comparative Example 8 | 0.30 | 0.65 | 0.05 | 1.01 | 1.02 | 1.03 | 12 |
| 48 | Comparative Example 9 | 0.30 | 0.65 | 0.05 | 0.73 | 0.73 | 0.73 | 13 |

As shown in Table 2, when s1, t1, and u1 are less than 0.75, heterophases are induced and therefore the maximum Pm of spontaneous polarization is small. When s1, t1, and u1 are greater than 1.00, the maximum Pm of spontaneous polarization is also small due to the growth of extraordinary grains or the like.

While a method for forming a piezoelectric thin film has been described using the PLD process, the piezoelectric thin film can be formed by a sputtering process, a solution process, a chemical evaporation process, or the like.

It has been confirmed that substantially similar results are obtained in the case of fabricating a piezoelectric device by a solid-state reaction process using a piezoelectric composition.

While the present invention has been described with reference to the embodiments and the examples, the present invention is not limited to the embodiments or the examples. In the embodiments and the examples, only the case where the first and second compounds are contained is described. However, another compound may be contained in addition to the first and second compounds.

A piezoelectric composition according to the present invention can be widely used in areas such as actuators, sensors, and resonators.

What is claimed is:

1. A piezoelectric composition containing a major component that is a perovskite-type oxide which is represented by the general formula $ABO_3$, which contain no Pb, and which has A-sites containing Bi, Na and K and B-sites containing Ti, wherein the Ti is partially substituted with a transition metal Me that is at least one selected from the group consisting of Mn, Cr and Co and the content of Bi and the transition metal Me in the perovskite-type oxide, which is the major component is more than 20 mole percent to 43 mole percent in terms of $Bi_{u1}MeO_3$, where $0.75 \leq u1 \leq 1.0$, wherein the major component has a perovskite structure and is represented by the following formula:

$$(1-x-y)(Bi_{0.5}Na_{0.5})_{s1}TiO_3 - y(Bi_{0.5}K_{0.5})_{t1}TiO_3 - xBi_{u1}MeO_3$$

where $0.2 < x \leq 0.43$, $0.05 \leq y < 1$, $x+y < 1$, $0.75 \leq s1 \leq 1.0$, $0.75 \leq t1 \leq 1.0$, $0.75 \leq u1 \leq 1.0$, and the transition metal Me is at least one selected from the group consisting of Mn, Cr and Co.

2. A piezoelectric device comprising the piezoelectric composition according to claim 1.

3. The piezoelectric composition according to claim 1, wherein $0.25 \leq x \leq 0.35$.

* * * * *